United States Patent
Ratowsky et al.

(10) Patent No.: US 7,649,916 B2
(45) Date of Patent: Jan. 19, 2010

(54) SEMICONDUCTOR LASER WITH SIDE MODE SUPPRESSION

(75) Inventors: Richard P. Ratowsky, Berkeley, CA (US); Ashish K. Verma, San Jose, CA (US); Lars Eng, Mountain View, CA (US)

(73) Assignee: Finisar Corporation, Sunnyvale, CA (US)

( * ) Notice: Subject to any disclaimer, the term of this patent is extended or adjusted under 35 U.S.C. 154(b) by 59 days.

(21) Appl. No.: 10/880,655

(22) Filed: Jun. 30, 2004

(65) Prior Publication Data

US 2006/0002441 A1    Jan. 5, 2006

(51) Int. Cl.
 *H01S 3/098* (2006.01)
(52) U.S. Cl. .............................. 372/19; 372/32; 372/33; 372/45.01; 372/29.02; 385/129; 385/130; 385/131; 385/132
(58) Field of Classification Search .................... 372/19, 372/29.02, 32, 33, 45.01; 385/129–132
 See application file for complete search history.

(56) References Cited

U.S. PATENT DOCUMENTS

| | | | | | |
|---|---|---|---|---|---|
| 3,740,661 | A | * | 6/1973 | D'Asaro | 372/45.01 |
| 3,838,359 | A | * | 9/1974 | Hakki et al. | 372/45.01 |
| 3,980,392 | A | * | 9/1976 | Auracher | 385/43 |
| 4,077,019 | A | * | 2/1978 | Streifer et al. | 372/45.01 |
| 4,269,635 | A | * | 5/1981 | Logan et al. | 438/40 |
| 4,340,967 | A | * | 7/1982 | Dixon et al. | 372/46.01 |
| 4,701,009 | A | * | 10/1987 | Tangonan et al. | 385/14 |
| 5,373,166 | A | * | 12/1994 | Buchan et al. | 257/18 |
| 5,528,616 | A | * | 6/1996 | Kash et al. | 372/45.01 |
| 5,539,759 | A | * | 7/1996 | Chang-Hasnain et al. | 372/19 |
| 5,559,912 | A | * | 9/1996 | Agahi et al. | 385/42 |
| 5,936,994 | A | * | 8/1999 | Hong et al. | 372/96 |
| 5,960,023 | A | * | 9/1999 | Takahashi | 372/96 |
| 6,282,345 | B1 | * | 8/2001 | Schimpe | 385/50 |
| 6,879,751 | B2 | * | 4/2005 | Deliwala | 385/25 |
| 6,940,883 | B2 | * | 9/2005 | O'Gorman et al. | 372/46.01 |
| 7,577,327 | B2 | * | 8/2009 | Blauvelt et al. | 385/39 |
| 2002/0061046 | A1 | * | 5/2002 | Takiguchi et al. | 372/96 |
| 2003/0147439 | A1 | * | 8/2003 | Shams-Zadeh-Amiri et al. | 372/45 |
| 2004/0062286 | A1 | * | 4/2004 | Masood et al. | 372/102 |
| 2006/0187986 | A1 | * | 8/2006 | Jow et al. | 372/45.01 |

OTHER PUBLICATIONS

Born and Wolf, "Principle of Optics," Seventh (expanded) Edition, 1999, pp. 16-19.*

* cited by examiner

*Primary Examiner*—Wael Fahmy
*Assistant Examiner*—Hrayr A Sayadian
(74) *Attorney, Agent, or Firm*—Workman Nydegger

(57) ABSTRACT

Systems and methods for stripping an optical mode from a semiconductor laser. A waveguide layer is included in the semiconductor laser and is typically arranged beneath the active region. The waveguide layer is configured to match the phase of the second order mode. The waveguide layer does not substantially match the primary optical mode of the laser. By matching the phase of the second order mode, the confinement of the second order mode is reduced and the second order mode strongly couples with the waveguide layer. The optical confinement of the primary mode is not substantially reduced. The side-mode suppression ratio is thereby improved by stripping the second order mode from the active region.

17 Claims, 3 Drawing Sheets

SEMICONDUCTOR LASER WITH SIDE MODE SUPPRESSION

BACKGROUND OF THE INVENTION

1. The Field of the Invention

The present invention relates to the field of semiconductor lasers. More particularly, the present invention relates to systems and methods for suppressing second order modes in semiconductor lasers.

2. The Relevant Technology

Lasers are some of the primary components of optical networks. They are often used, for example, in optical transceivers to generate the optical signals that are transmitted over an optical network. Lasers are also used to pump various types of optical amplifiers, such as Raman amplifiers and erbium-doped amplifiers.

Edge-emitting lasers such as Fabry-Perot lasers, Distributed Feedback lasers (DFB lasers), and distributed Bragg reflector lasers (DBR lasers), etc., are examples of semiconductor lasers used in optical environments. Ridge waveguide lasers are a form of edge-emitting lasers that have an etched ridge.

The output spectrum of semiconductor lasers such as edge-emitting lasers is often related to the length of the laser's cavity. Because edge-emitting lasers tend to have relatively long cavities, there are several wavelengths that may lase within the cavity. As a result, many edge-emitting lasers are often referred to as multiple longitudinal mode (MLM) lasers.

The output spectrum of MLM lasers may have a spectral width of around 10 nanometers, but the spectral width can vary from one laser to the next. Although MLM lasers can be useful in various applications, MLM lasers become less useful as the speed of an optical network increases. In other words, using MLM lasers in high speed optical networks typically leads to chromatic dispersion. In addition, wavelength division multiplexing (WDM) systems experience substantial crosstalk when MLM lasers are used.

One of the ways that the spectral width of a semiconductor laser is reduced is to use distributed reflectors such as in a distributed feedback laser (DFB laser) or a DBR laser. A DFB laser or a DBR laser both typically have a spectral width that is more narrow than a simple Fabry-Perot laser. In some lasers, a mesa or ridge may also be formed by etching away part of the semiconductor laser. The ridge also helps to make the semiconductor laser emit a single mode.

In fact, the modes emitted by the laser can be affected by the width of the mesa or ridge. If the ridge is too wide, the laser may support a $2^{nd}$ order transverse mode, so that two modes exist for each longitudinal mode. Unfortunately, a narrow width, which may result in a more narrow spectral width, has performance disadvantages such as reduced optical confinement that leads to higher threshold currents and higher voltages which lead to poor thermal performance. The ability to fabricate a single mode laser is also complicated by the material gain of the laser. At lower temperatures, the material gain of a semiconductor laser tends to blueshift (move to shorter wavelengths). Because the second order transverse mode of a laser is located on the blue side of the main mode of the semiconductor laser, the second order mode may affect the performance of the semiconductor laser.

BRIEF SUMMARY OF THE INVENTION

These and other limitations are overcome by embodiments of the present invention, which relate to systems and methods for reducing or removing optical modes from a semiconductor laser. Semiconductor lasers including distributed feedback (DFB) lasers and DBR lasers may exhibit a poor side mode suppression ratio and embodiments of the invention change the side mode suppression ratio by removing or reducing the second order mode. The poor side mode suppression ratio of a semiconductor laser becomes more prominent at lower temperatures because the gain of the material tends to move to shorter wavelengths (blueshift) at lower temperatures. The second order mode is located on the short wavelength side of the primary mode. As a result, a shift to shorter wavelengths can lead to poor side mode suppression ratios.

In one embodiment, a waveguide layer such as a planar slab waveguide layer is included in a semiconductor laser. The waveguide layer may be located beneath the active region of the laser structure such that it may be unbounded laterally. The waveguide layer is typically lattice matched to the structure of the laser and is also configured such that the phase velocity of a mode it supports corresponds to the phase velocity of the active region's second order mode. At the same time, the phase velocity associated with the waveguide layer is further away from the phase velocity of the primary mode. As a result, the strength of optical coupling between the waveguide layer is stronger for the second order mode than the primary or main mode.

Because the coupling between the waveguide layer and the secondary mode is strong, the confinement of the secondary mode to the active region of the laser is reduced and the secondary mode is effectively stripped from the laser into the waveguide layer. At the same time, the optical confinement of the primary mode is not significantly reduced because the coupling between the waveguide layer and the active region for the primary mode is much weaker. As a result, the side mode suppression ratio improves.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

Semiconductor lasers including edge-emitting lasers often emit more than one longitudinal mode. To reduce problems associated with, for example, chromatic dispersion and crosstalk, it is desirable to produce lasers that have a narrow wavelength spectrum. In other words, it is often desirable to produce lasers that emit a single mode. As previously stated, however, edge-emitting lasers typically have relatively long cavities that can support many longitudinal modes.

The ability of a semiconductor laser to generate a particular mode while suppressing or filtering other modes may be quantified using a side-mode suppression ratio (SMSR). For example, the SMSR may determine how well a second order mode (or other mode) is suppressed relative to the main or primary mode of the laser.

Embodiments of the present invention relate to systems and methods for improving the SMSR of semiconductor lasers including edge-emitting lasers and/or ridge waveguide lasers. In one embodiment, the present invention improves the SMSR of a semiconductor at low temperatures when the material gain blueshifts such that the primary mode has reduced gain relative to the secondary or second order mode. Examples of edge-emitting lasers and/or ridge waveguide lasers may further include, but are not limited to, Fabry Perot lasers, DFB lasers, DBR lasers, external cavity lasers, and the like.

Figure 1:
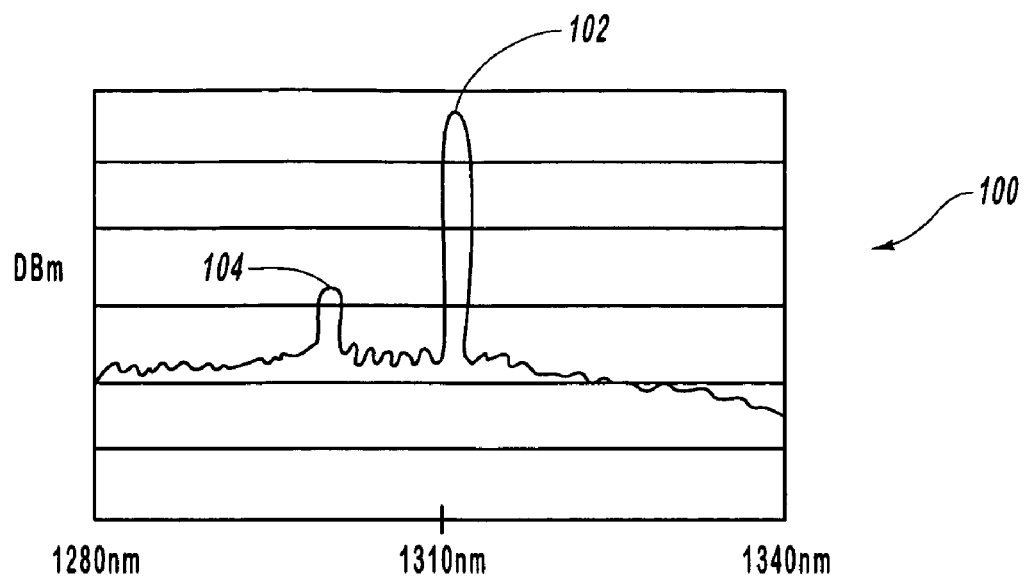
FIG. 1 illustrates an example of a primary mode and a secondary mode in a semiconductor laser.

FIG. 1 illustrates a plot of a primary mode and a secondary mode of a semiconductor laser. The plot 100 illustrates a primary mode 102. The primary mode 102 corresponds to a longitudinal mode and is emitted, in this example, at a wavelength of about 1310 nanometers. This example illustrates the onset of a secondary mode 104 that is to the shorter wavelength side or blue side of the primary mode 102. As previously described, a secondary mode in systems such as WDM systems can induce crosstalk as well as chromatic dispersion.

At low temperatures, the material gain of semiconductor lasers blueshifts or moves to shorter wavelengths. As a result, the power in the secondary mode 104 increases at lower temperatures. The onset of the secondary mode 104 can decrease the SMSR of the semiconductor laser as previously described.

Figure 2A:
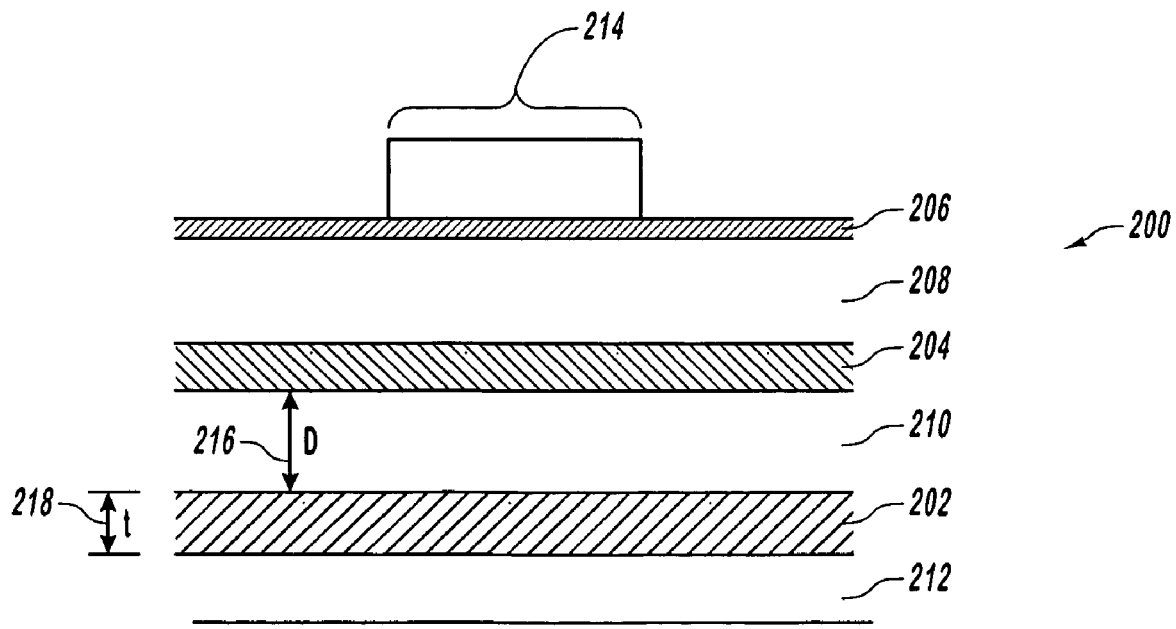
FIG. 2A illustrates an example of a semiconductor laser with a waveguide layer that optically couples with a secondary mode.

FIG. 2A illustrates one embodiment of the present invention to reduce the second order mode. The laser 200 includes a substrate 212 with various layers arranged over the substrate 212. In this example, an n-type semiconductor layer 210 is arranged over the substrate 212 and the active region 204 is arranged over the semiconductor layer 210. A p type semiconductor layer 208 is arranged or formed over the active region 204.

The laser 200 may be a DFB or a DBR laser, for example, and the laser 200 may also include a grating 206. After the grating 206 is etched and defined, InP or other suitable material may be regrown and the laser is then fabricated using a standard ridge waveguide process. The grating 206 serves as the etch stop layer during the ridge waveguide process.

The active region 204 is effectively located at a pn junction. In one embodiment, the active region 204 includes a multi-quantum well structure. The material system of the quantum wells is InGaAlAs in this example. The active region 204 may include 6 quantum wells interleaved with 7 barrier layers, although one of skill in the art can appreciate that the invention may be implemented using more or fewer quantum wells and that other materials may be used in the quantum wells.

Each quantum well may have a thickness on the order of 5 nm while the barrier layers may each have a thickness on the order of 8.5 nm. In some embodiments, the barrier layers and/or the quantum wells are tensile strained or compressive strained. In one embodiment, the quantum wells are compressive strained and the barrier layers and tensile strained. The photoluminescence of the active region 204 in this example is on the order of 1300 nm. One of skill in the art can appreciate an active region having a photoluminescence that is greater or lower.

Figure 2B:
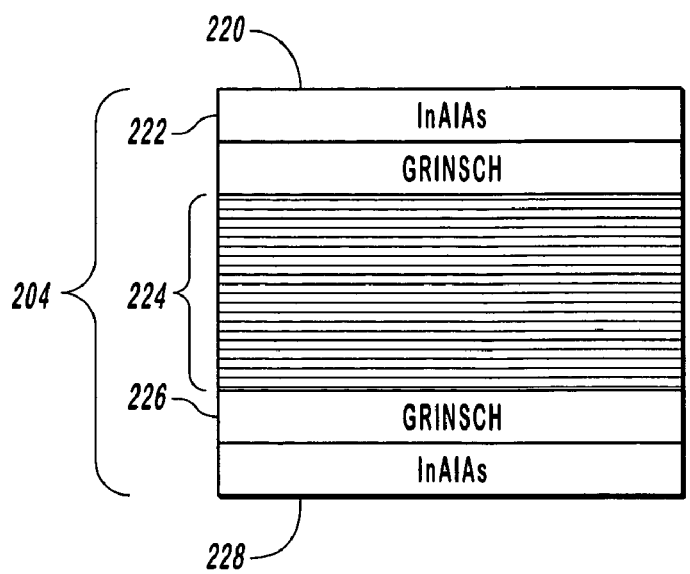
FIG. 2B illustrates one embodiment of an active region of a semiconductor laser that includes a waveguide layer to reduce a side-mode suppression ratio.

FIG. 2B illustrates one embodiment of an active region 204. More particularly in FIG. 2B, the active region 204 may also include graded index separate confinement heterostructure (GRINSCH) layers 222, 226. The GRINSCH layers 222, 226 sandwich the multi-quantum well structure 224 and are each on the order of 120 nanometers thick. For each GRINSCH layer 222, 226, the bandgap ramps down from 960 nanometers to 850 nanometers moving away from the multi-quantum well structure 116. Each GRINSCH layer 222, 226 is followed by a layer of InAlAs 220, 228 that is 50 to 100 nanometers thick.

Thus the InAlAs layer 228 would be formed on the layer 210. The p-type semiconductor layer 208 is formed on the other InAlAs layer 222 in this example. The p-type semiconductor layer 208 is typically formed from InP. The grating layer 206 is formed or grown on the layer 208 and is followed by a cap layer in which a ridge waveguide process is performed to form a ridge in the laser 100. The grating layer 206 acts as an etch stop. The metal contact may then be deposited or formed after the ridge is formed in one embodiment.

The laser 200 also includes a waveguide layer 202 as illustrated in FIG. 2A. The waveguide layer is typically formed beneath the active region 204. In an InP based laser, the waveguide may be InGaAsP lattice matched to InP. The specific composition or other parameters of the waveguide layer 202 can be altered as described below to improve the SMSR.

Figure 3:
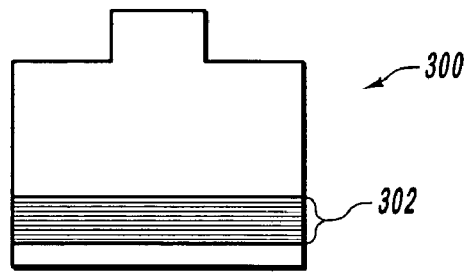
FIG. 3 illustrates another embodiment of the waveguide layer to reduce side-mode suppression ratio.
Figure 4:
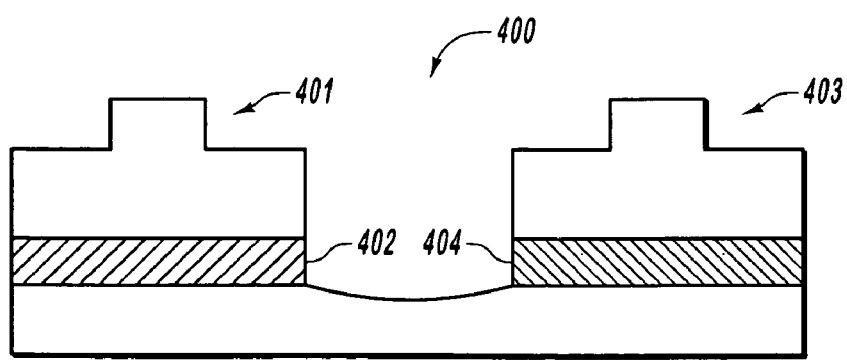
FIG. 4 illustrates yet another embodiment of the waveguide layer used to reduce side-mode suppression ratio.

FIGS. 3 and 4 illustrate alternative embodiments of the invention. In FIG. 3, the waveguide layer 302 of the laser 300 includes multiple layers. In one embodiment, the multiple layers in the waveguide layer 302 are distributed Bragg layers. FIG. 4 illustrates a laser array 400. In FIG. 4, a ridge waveguide structure 401 is formed laterally adjacent to a ridge waveguide structure 403. The structure 402 includes a waveguide layer 402 that can optically couple with the active region 404 of the structure 403. The waveguide layer 402 is located sufficiently near the active region 403 for optical coupling to occur.

Returning to FIG. 2A, the waveguide layer 202 has a thickness 218 (t). When t=0 or when the waveguide layer 202 is not present, and for typical width values of the mesa 214, the laser 200 may support a second order mode that can lead to the SMSR failure previously described. As the thickness 218 increases, the speed of light (or the phase velocity) in the waveguide layer approaches the phase velocity of the second order mode. As a result, the second order mode couples with the waveguide layer 202. In this example, the waveguide layer may have a thickness of about 115 nanometers and have a photoluminescence peak of about 1200 nanometers.

The waveguide layer 202 is a planar waveguide in this example and the second order mode is effectively coupled into the waveguide layer 202. In other words, the optical confinement of the second order mode is reduced from its value when the thickness 218 equals zero. The confinement of the primary mode is not affected because the phase velocity of the waveguide layer is further away from the phase velocity of the primary mode. Thus, the optical confinement of the primary mode is not affected.

Figure 5A:
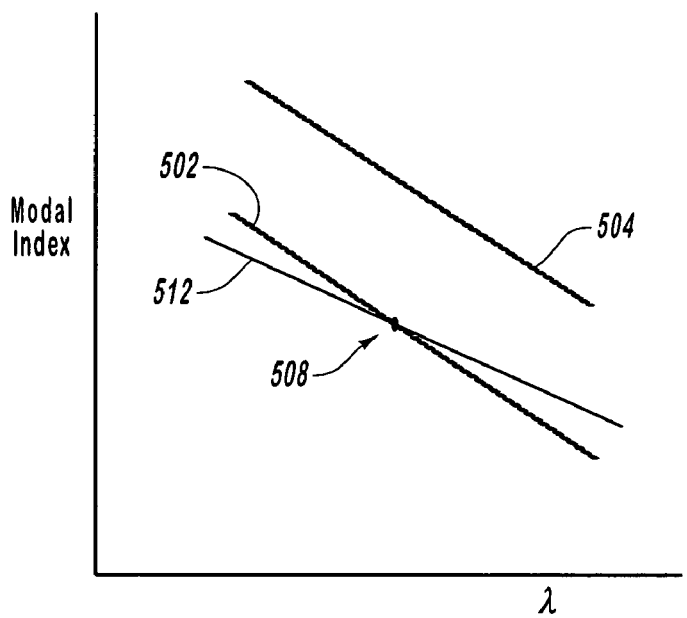
FIG. 5A illustrates a plot of the modal index of the waveguide layer for a primary mode and a secondary optical mode with respect to the modal index of the active region as a function of wavelength.

The effect of the waveguide layer on the confinement of the optical modes of the active region is further illustrated in FIG. 5A. FIG. 5A plots the modal index (phase velocity) of a mode of the waveguide structure as well as the modal index of the modes of the active region as a function of wavelength. The strength of coupling between the waveguide layer and the active region modes can be either wavelength dependent or wavelength independent. The waveguide layer is typically configured such that the modal index curve illustrated in FIG. 5A is approximately parallel to the curve of the active region. When the curve of the waveguide layer is substantially parallel to the curve of the active region, the optical coupling is wavelength independent.

The curves 504 and 502 correspond to the primary and secondary modes of the laser active region, respectively. The curve 512 corresponds to a mode of the waveguide layer. Because the modal index curve of the secondary mode 502 and the modal index curve of the waveguide layer 512 are close together, the secondary mode of the active region strongly couples with the waveguide layer. At the point 508, the strength of coupling is the strongest and the loss of confinement of the secondary mode is maximized at this point. The primary mode does not strongly couple with the waveguide layer because its modal index, as represented by the curve 504, is not well matched to the modal index of the waveguide layer 512. This suggests that the optical confinement of the primary mode is not substantially reduced while the optical confinement of the second order mode is reduced. The primary mode and secondary mode lase at different wavelengths, but the above conditions are satisfied over a larger wavelength range than the separation of the primary and secondary lasing wavelengths, which is typically 5 to 10 nm.

Figure 5B:
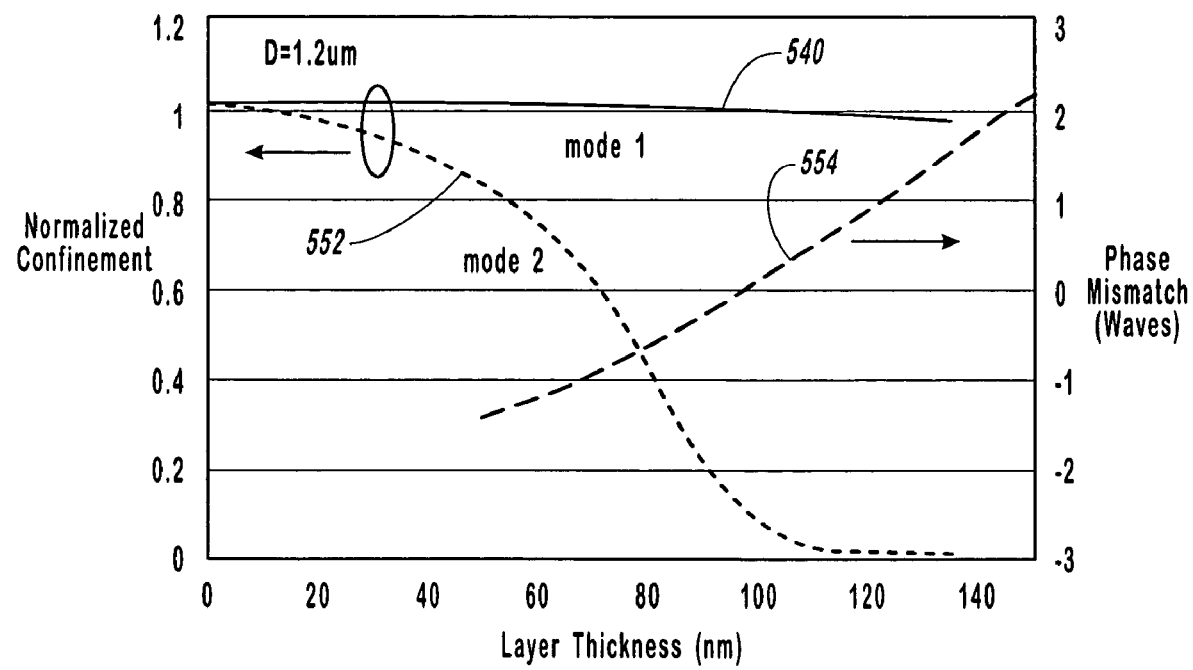
FIG. 5B illustrates a plot of the confinement of a primary optical mode and a secondary optical mode in an active region of a semiconductor laser.

FIG. 5B plots the confinement of the primary and secondary mode to the active region. FIG. 5B plots the confinement of the primary and secondary modes to the active region, normalized to their values when the thickness 218=0. In this example, the distance 216 (D) in FIG. 2A is 1.2 micrometers and the waveguide layer has a bandgap of 1200 nanometers. The curve 550 corresponds to the optical confinement, the curve 552 corresponds to the optical confinement of the secondary mode and the curve 554 corresponds to the primary mode. As the phase mismatch goes through zero and becomes positive when the thickness of the waveguide layer is on the order of 100 nanometers, the mode confinement of the secondary mode is essentially zero. As the thickness increases, the waveguide layer begins to influence the primary mode. One result is that the waveguide layer permits the active region to be effectively single mode well above the width limit of a conventional waveguide laser.

Various parameters of the feedback layer may also be adjusted to impact the mode confinement. Examples of parameters include, but are not limited to, thickness of the waveguide layer, location of the waveguide layer with respect to the active region (thickness of the layer 206, for example), material composition or formulation of the waveguide layer, refractive index of the waveguide layer, modal index of the waveguide layer, and any combination thereof. Another parameter may be the number and type of layers in the waveguide layer. One of skill in the art can also appreciate that the formulation of the active region can also be adjusted to impact the mode confinement and/or the material gain of the active region.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A semiconductor laser for reducing a second order mode, the laser comprising:
   a substrate;
   an active region arranged over the substrate, wherein the active region includes one or more quantum wells that produce a primary mode and a second order mode; and
   a waveguide layer arranged over the substrate and having a thickness wherein a confinement of the second order mode in the active region is reduced by the waveguide layer more than a confinement of the primary mode in the active region so as to suppress the second order mode;
   wherein the waveguide layer and the active layer are part of the same epitaxial structure; and
   a semiconductor layer between the waveguide layer and the active region, wherein the materials of the active region, the waveguide layer, and the semiconductor layer and the thicknesses of the semiconductor layer and the waveguide layer are selected such that the modal index of waveguide layer for the secondary mode substantially matches the modal index of the active layer for the second order mode and the modal index of the waveguide layer for the fundamental mode does not match the modal index of the active layer for the primary mode such that the second order mode couples into the waveguide layer more than the first order mode.

2. A laser as defined in claim 1, wherein the waveguide layer has a thickness of about 115 nanometers when a photoluminescence of the active region is about 1300 nanometers.

3. A laser as defined in claim 1, wherein the waveguide layer is InGaAsP and is lattice matched to InP.

4. A laser as defined in claim 1, further comprising:
   a grating arranged over the active region; and
   a ridge arranged over the grating.

5. A laser as defined in claim 1, wherein the semiconductor layer between the active region and the waveguide layer is an n-type semiconductor layer.

6. A laser as defined in claim 5, wherein the n-type semiconductor layer has a thickness on the order of 1.3 micrometers.

7. A laser as defined in claim 1, wherein the waveguide layer comprises multiple layers.

8. A laser as defined in claim 7, wherein the multiple layers arc distributed Bragg layers.

9. A semiconductor laser with an improved side mode suppression ratio, the semiconductor laser comprising:
   a substrate;
   an active region arranged over the substrate, the active region including a plurality of quantum wells separated by barrier layers and having a first order mode and a second order mode;
   a grating arranged over the active region;
   a ridge formed over the grating;

a waveguide layer arranged at least partially between the active region and the substrate and having a thickness, wherein the waveguide layer is separated from the active region by a distance, and wherein the materials of the active region and the waveguide layer, the distance, and the thickness are chosen such that the phase velocity of second order mode in the waveguide layer substantially matches the phase velocity of the second order mode in the active region, and the phase velocity of the first order mode in the active region does not match the phase velocity of the first order mode in the waveguide layer, such that the second order mode couples into the waveguide layer more than the first order mode, thereby suppressing the second order mode of the semiconductor laser;

wherein the waveguide layer and the active layer are part of the same epitaxial structure.

10. A semiconductor laser as defined in claim 9, wherein the waveguide layer is arranged between the active region and the substrate, the semiconductor laser further comprising:

a second semiconductor layer formed between the active region and the grating.

11. A semiconductor laser as defined in claim 9, wherein the waveguide layer further comprises distributed Bragg layers.

12. A semiconductor laser as defined in claim 9, wherein the phase velocity of the waveguide layer is wavelength dependent.

13. A semiconductor laser as defined in claim 9, wherein the waveguide layer is InGaAsP and is lattice matched to InP.

14. A semiconductor laser as defined in claim 9, wherein the waveguide layer has a thickness of about 115 nanometers and a photolumineseence peak of about 1200 nanometers.

15. A semiconductor laser as defined in claim 14, wherein a photoluminescence peak of the active region is about 1300 nanometers.

16. A laser as defined in claim 1, wherein the laser is an edge emitting laser.

17. A laser as defined in claim 16, wherein the laser is a DFB or a DBR laser.

* * * * *

UNITED STATES PATENT AND TRADEMARK OFFICE
CERTIFICATE OF CORRECTION

PATENT NO. : 7,649,916 B2  
APPLICATION NO. : 10/880655  
DATED : January 19, 2010  
INVENTOR(S) : Ratowsky et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 181 days.

Signed and Sealed this

Twenty-third Day of November, 2010

David J. Kappos  
*Director of the United States Patent and Trademark Office*